(12) United States Patent
Hirayanagi (10) Patent No.: US 6,433,346 B1
(45) Date of Patent: Aug. 13, 2002

(54) ELECTROSTATIC RETICLE CHUCKS, CHARGED-PARTICLE-BEAM MICROLITHOGRAPHY APPARATUS AND METHODS, AND SEMICONDUCTOR-DEVICE MANUFACTURING METHODS COMPRISING SAME

(75) Inventor: Noriyuki Hirayanagi, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/560,913

(22) Filed: Apr. 28, 2000

(30) Foreign Application Priority Data

Oct. 19, 1999 (JP) .......................................... 11-296573

(51) Int. Cl.[7] .............................................. H01J 37/20
(52) U.S. Cl. ................................... 250/492.2; 361/234
(58) Field of Search ..................... 250/492.2; 430/296; 361/234

(56) References Cited

U.S. PATENT DOCUMENTS

| | | | | |
|---|---|---|---|---|
| 4,667,110 A | * | 5/1987 | Kariya | 250/492.2 |
| 5,382,469 A | * | 1/1995 | Kubota et al. | 361/234 |
| 5,751,538 A | * | 5/1998 | Nakasuji | 361/234 |

FOREIGN PATENT DOCUMENTS

| | | |
|---|---|---|
| JP | 05-063062 | 3/1993 |
| JP | 07-283297 | 10/1995 |
| JP | 10-050584 | 2/1998 |
| JP | 10-116782 | 5/1998 |

OTHER PUBLICATIONS

Kubota, Yoshihiro, "Seiden Chakku to Sono Ouyou (The Electrostatic Chuck and its Application),"*Denshi Zairyou (Electronics Materials)*, Jul. 1996, p. 51.

Balakrishnan et al., "Johnsen–Rahbek Effect with an Electronic Semi–Conductor," *British J. Appl. Phys.* 1:211–213 (1950).

Field, John, "Electrostatic Wafer Clamping for Next–Generation Manufacturing," *Solid State Technol.*, pp. 91–98, Sep. 1994.

Watanabe et al., "Relationship between Electrical Resistivity and Electrostatic Force of Alumina Electrostatic Chuck," *Jpn. J. Appl. Phys.* 32:864–871 (1993).

* cited by examiner

Primary Examiner—Jack Berman
(74) Attorney, Agent, or Firm—Klarquist Sparkman LLP (57) ABSTRACT

Electrostatic reticle chucks are disclosed that provide strong reticle-holding force and that can be used in a subatmospheric-pressure environment as encountered in charged-particle-beam microlithography. The chucks are suited especially for holding reticles made from a silicon reticle substrate. The attractive force is established between a reticle-contacting surface of the chuck comprising a dielectric material, and the reticle. Depthwise beneath the dielectric material is at least one electrode. The dielectric material has a property such that, when the electrode is energized, the reticle is attracted to the reticle-contacting surface by a Johnsen-Rahbek force. To such end, by way of example, the dielectric material has a volume resistivity of no greater than $10^{13}$ Ω-cm. The Johnsen-Rahbek force holds the reticle much more strongly than the Coulomb force produced by conventional reticle chucks.

22 Claims, 6 Drawing Sheets

FIG. 7  Lithography Step

# US 6,433,346 B1

ELECTROSTATIC RETICLE CHUCKS, CHARGED-PARTICLE-BEAM MICROLITHOGRAPHY APPARATUS AND METHODS, AND SEMICONDUCTOR-DEVICE MANUFACTURING METHODS COMPRISING SAME

FIELD OF THE INVENTION

The present invention relates to reticle (mask) holders (i.e., "chucks") as used in microlithography apparatus and methods employed in the manufacture of semiconductor devices, displays, and the like. More particularly, the invention pertains to reticle chucks useful in a low-pressure atmosphere as encountered in charged-particle-beam microlithography.

BACKGROUND OF THE INVENTION

Microlithography is a key technology used in the fabrication of semiconductor integrated circuits, displays, and the like. In microlithography, an image of a circuit pattern, defined by a mask or reticle, is projected onto the surface of a "sensitized" substrate such as a semiconductor wafer coated with a suitable "resist."

In view of the resolution limits of optical microlithography, a large amount of effort currently is being devoted to the development of microlithography systems that use a charged particle beam (e.g., electron beam or ion beam) to transfer a pattern, defined on a mask or reticle, to a sensitized substrate (e.g., semiconductor wafer). Charged-particle-beam (CPB) microlithography offers prospects of improved resolution compared to optical microlithography.

Figure 3:
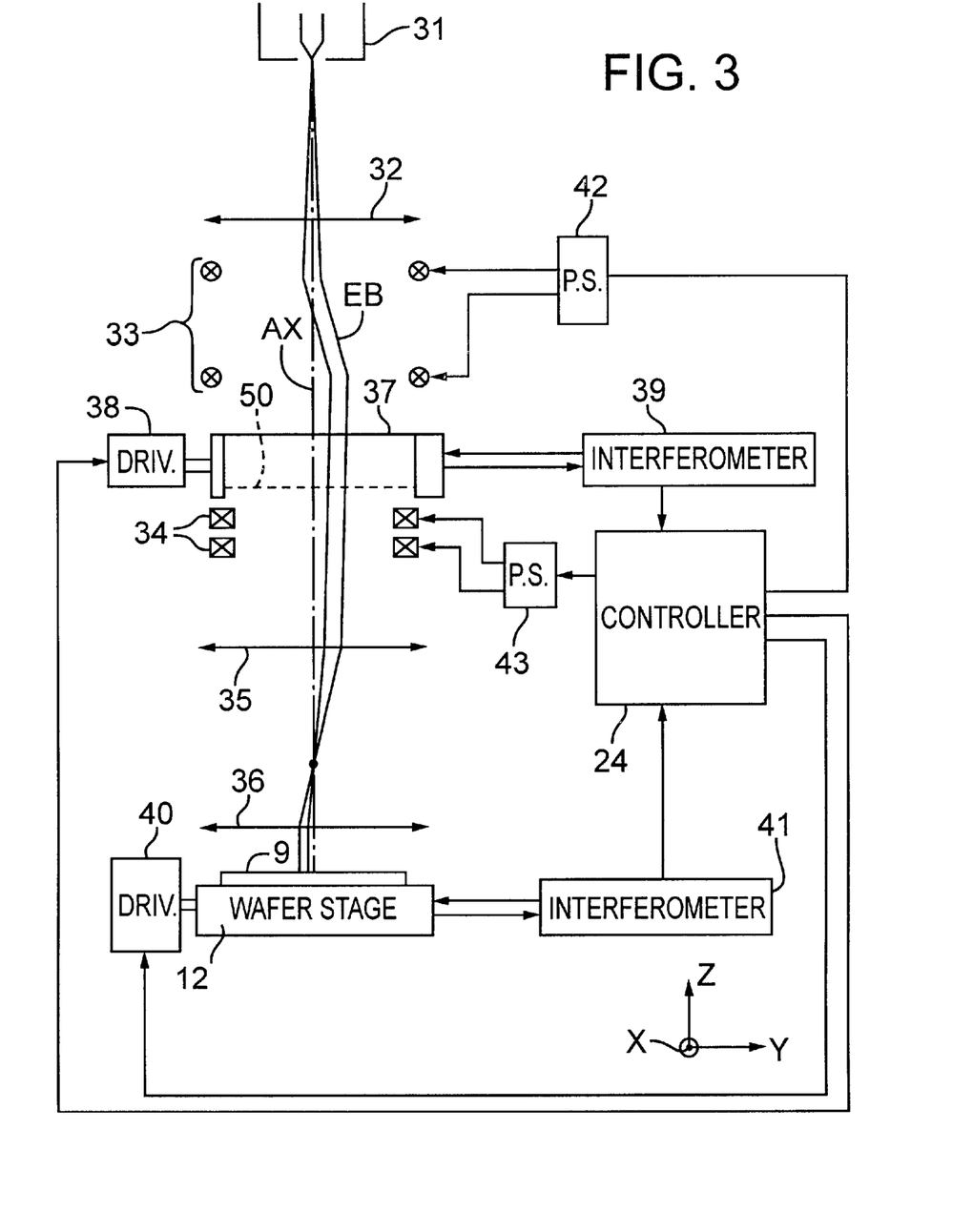
FIG. 3 is a schematic elevational diagram of a charged-particle-beam microlithography system with which a reticle chuck according to the invention can be used.

FIG. 3 shows a CPB microlithography system for projection-exposing a reticle pattern. An electron beam EB emitted from an electron gun 31 propagates along an axis AX and is collimated by a condenser lens 32. The electron beam is deflected within an XY plane by a field-selection deflector 33 to direct the beam to a "subfield" or other exposure unit of a reticle 50. A "subfield" is a region of the reticle 50 hat is illuminated by the electron beam at any given instant of time, and normally defines a small respective portion of the overall pattern defined by the reticle. The electron beam propagating from the electron gun 31 to the reticle 50 is termed the "illumination beam." As the illumination beam passes through the reticle 50, the beam acquires an ability to form an image of the illuminated subfield, and hence is termed a "patterned beam." The patterned beam experiences a prescribed magnitude and direction of lateral deflection imparted to the beam by a deflector 34 that causes the patterned beam to be incident on a prescribed region of the substrate ("wafer") 9. The illuminated region of the wafer 9 corresponds to the particular subfield of the reticle 50 actually being illuminated by the illumination beam. As the patterned beam propagates to the wafer 9, the patterned beam passes through first and second projection lenses 35, 36, respectively, (collectively comprising a "projection-lens system") to form an image of the respective pattern portion on the surface of the wafer 9. The size of the image as formed on the wafer 9 is "reduced" (demagnified) according to a prescribed demagnification ratio of the projection-lens system.

The reticle 50 is mounted on a reticle stage 37 so as to extend parallel to an X-Y plane (in FIG. 3, the X-axis extends perpendicularly to the plane of the page). During microlithographic exposure of the wafer 9, the reticle stage 37 is driven continuously in the X-axis direction and stepwise in the Y-axis direction by a stage driver 38. The position of the reticle stage 37 in the X-Y plane is sensed by a respective laser interferometer 39 that produces respective output signals routed to a controller 24.

The wafer 9 is mounted on a wafer stage 12 and extends in an X-Y plane parallel to the reticle 50. During exposure, the wafer stage 12 is driven continuously in the X-axis direction and stepwise in the Y-axis direction by a stage driver 40. Because the image is inverted by the projection lenses 35, 36, the direction of travel of the wafer stage 12 in both the continuous-motion direction and the stepwise-motion direction during exposure are opposite the corresponding motions of the reticle stage 37. The position in the X-Y plane of the wafer stage 12 is sensed by a respective laser interferometer 41 that produces output signals routed to controller 24.

Deflector power supplies 42, 43 provide electrical power to the deflectors 33, 34, respectively, under control of the controller 24.

Figure 4:
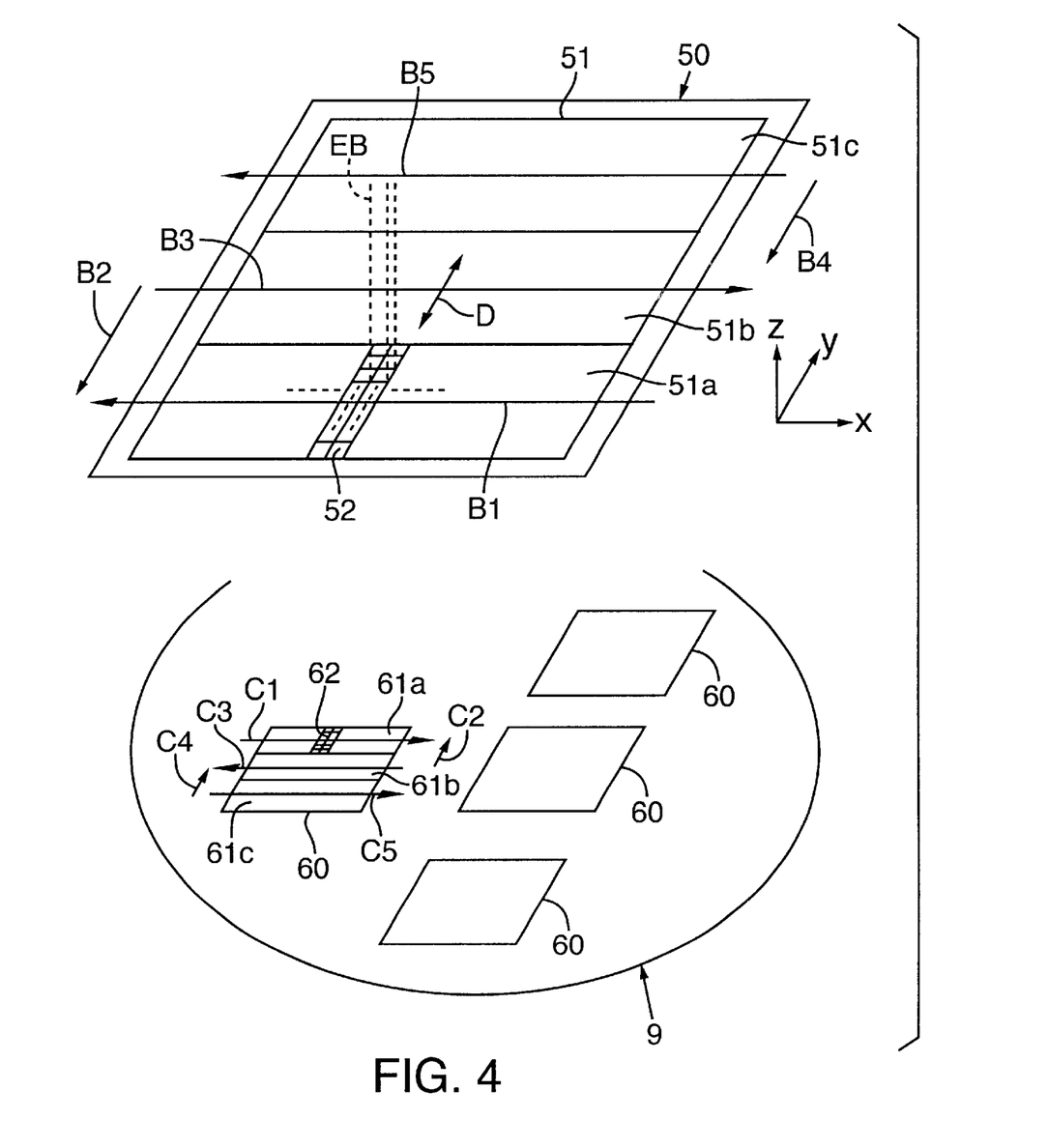
FIG. 4 depicts certain projection-exposure relationships of a reticle relative to a wafer as encountered in CPB microlithography.

FIG. 4 illustrates various relationships extant between the reticle 50 and the wafer 9. The areas 60 shown on the wafer 9 are "dies." (A die is a separate area on the wafer 9 into which an entire pattern from the reticle 50 is to be transferred.) For use in a microlithography apparatus such as that shown in FIG. 3 (in which projection-exposure is performed by dividing the reticle pattern into subfields sized for the particular optical field of the projection-lens system), the pattern 51 of the reticle 50 is divided into multiple regions 51a, 51b, 51c termed "stripes." Each stripe has a length dimension that extends in the direction (X-direction) of continuous motion of the reticle 50. Each stripe 51a, 51b, 51c is further divided into multiple subfields 52 arranged by rows in each stripe. In a similar manner, each of the dies 60 on the wafer 9 can be represented as multiple "stripes" 61a, 61b, 61c, wherein each stripe is further divided into multiple "transfer subfields" 62.

During exposure of a pattern image onto a die 60, as the reticle 50 and wafer 9 complete one cycle of continuous motion, the respective pattern portions contained in each of the subfields 52 of a stripe 51a, 51b, 51c are projection-exposed, one after the other, into corresponding transfer subfields 62 of a respective stripe 61a, 61b, 61c. For example, in FIG. 4, as the reticle 50 moves continuously in the −X-direction (arrow B1) and the wafer 9 moves continuously in the +X-direction (arrow C1), the electron beam EB is deflected back and forth along the Y-axis (arrow D) to thus scan, in sequence, each of the subfields 52 of the stripe 51a. After completing exposure of the stripe 51a in this manner, the reticle 50 is stepped in the −Y-direction (arrow B2) and the wafer 9 is stepped in the +Y-direction (arrow C2). Next, as the reticle 50 and the wafer 9 are moved continuously in the +X- and −X-directions (arrows B3 and C3), respectively, the electron beam EB is deflected so as to illuminate, in sequence, the subfields 52 of the stripe 51b. After completing exposure of the stripe 51b, the reticle 50 is stepped in the −Y-direction (arrow B4) and the wafer 9 is stepped in the +Y-direction (arrow C4). Then the reticle 50 and wafer 9 are moved continuously in the −X- and +X-directions (arrows B5 and C5), respectively, to expose the stripe 51c. This sequence of exposure steps is repeated until the reticle pattern has been exposed in each of the dies 60 of the wafer 9.

Figure 5:
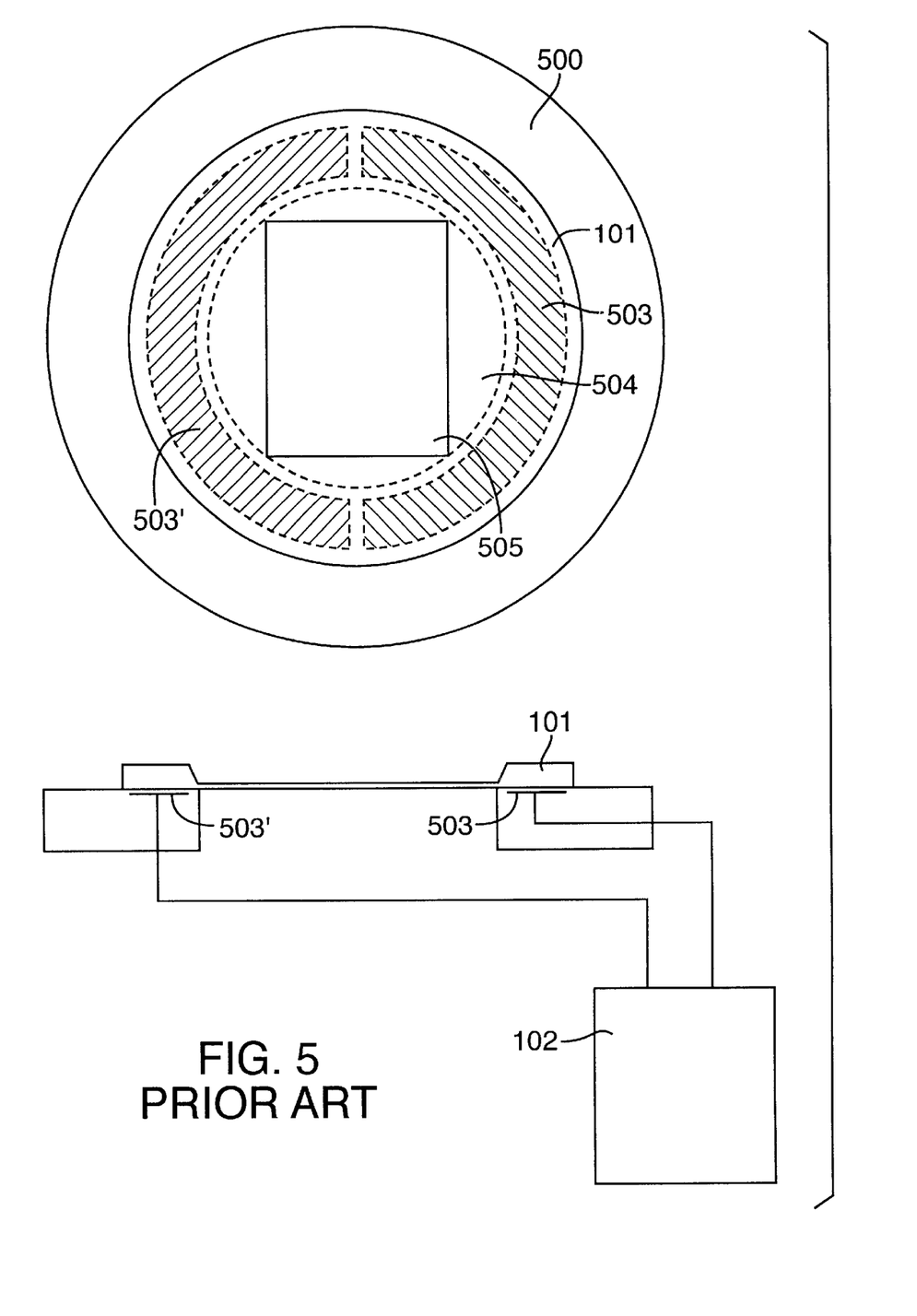
FIG. 5 provides two orthogonal views of a conventional electrostatic chuck.

FIG. 5 shows a conventional reticle holder ("reticle chuck") 500 suitable for mounting to the reticle stage 37 (FIG. 3) and configured to hold a reticle substrate 101. The reticle substrate 101 is placed on the reticle chuck 500 which holds the reticle by electrostatic attraction. The reticle chuck 500 comprises electrodes 503, 503' situated depthwise in the reticle chuck 500. The electrodes 503, 503' are connected to an electrode controller 502. Whenever the electrode controller 102 applies a voltage to the electrodes 503, 503', an electrostatic force is created that attracts and thus urges the reticle substrate 101 against the surface of the reticle chuck 500. In a region 504 of the reticle, as indicated in the figure, the reticle pattern can be defined, and an area 505 within the region 504 is where the pattern actually is defined.

An apparatus including an electrostatic chuck is disclosed, for example, in Japanese Kôkai Patent Document No. *Hei* 10-050584. Additional examples of electrostatic wafer chucks for use in other semiconductor manufacturing processes are disclosed in Japanese Kôkai Patent Document Nos. *Hei* 5-063062 and *Hei* 7-283297. For more information on electrostatic chuck operation, reference is made to Yoshihiro Kubota, "*Seiden Chakku to Sono Ouyou* ("The Electrostatic Chuck and its Application," *Denshi Zairyou* (*Electronics Materials*), July 1996, page 51.

Methods for fabricating certain types of reticles for use in CPB microlithography systems include an etching step to "machine" a silicon wafer in a manner yielding a reticle membrane having a thickness of 1–3 micrometers, and to form, in the membrane, openings (voids) shaped to define respective pattern features. Such a reticle is termed a "scattering-stencil reticle." Methods for fabricating other types of reticles include a step to machine a silicon wafer in a manner yielding a reticle membrane having a thickness of 1 micrometer or less. The pattern is defined by a corresponding pattern of a scattering material formed on the surface of the membrane. Such a reticle is termed a "scattering-membrane reticle." (See, for example, Japanese Kôkai Patent Document No. *Hei* 10-116782.)

Whenever microlithography is performed using a conventional electrostatic reticle chuck, movement of the reticle stage typically results in lateral shifting of the reticle relative to the reticle chuck. That is, whenever the reticle stage is moved (as described above) during exposure, the reticle is subjected to lateral forces that are highest at moments of greatest accelerations and decelerations of the reticle stage. Lateral reticle shifting occurs because the lateral forces generated by the accelerations and decelerations of the reticle stage are greater than the electrostatic attractive force produced by a conventional electrostatic chuck. This situation results in shifts and faulty registration of pattern features between adjacent layers, which greatly reduces production yields.

SUMMARY OF THE INVENTION

In view of the shortcomings of the prior art as summarized above, an object of the invention is to provide reticle chucks and reticle-holding methods that securely hold a reticle during use. Another object is to provide semiconductor device-manufacturing methods in which excessive time is not required for reticle-positioning alignments, thereby providing improved manufacturing yields.

To such ends, and according to a first aspect of the invention, electrostatic reticle chucks are provided for holding a reticle as used in charged-particle-beam microlithography. A first embodiment of such a chuck comprises a reticle-contacting surface formed of a dielectric material, and at least one electrode situated beneath the reticle-contacting surface of the dielectric material. The dielectric material (at least along the reticle-contacting surface) has a volume resistivity of no greater than $10^{13}$ $\Omega$-cm at ambient temperature. At such a volume resistivity, a strong electrostatic reticle-attractive force can be generated due to the Johnsen-Rahbek effect. In general, with Johnsen-Rahbek-type electrostatic attraction, the operations of reticle attraction and release can take more time than required when the attractive force is a Coulomb force. However, the attractive force is greater with the Johnsen-Rahbek effect. Fortunately, with a reticle chuck, the time required to develop or release the attractive force does not affect overall microlithographic throughput. Rather, the key benefit is the large and stable attractive force that can be obtained. Also important in producing the Johnsen-Rahbek effect is the reticle-contact surface(s) of the reticle chuck.

The reticle chuck summarized above is especially suitable for holding a reticle made from a silicon reticle substrate.

An electrostatic reticle chuck according to another embodiment comprises a reticle-contacting surface formed of a dielectric material, and at least one electrode situated beneath the reticle-contacting surface of the dielectric material. The reticle chuck is configured to attract and hold a reticle by Johnsen-Rahbek electrostatic attraction. Whereas the dielectric material beneath which an electrode is situated desirably has a volume resistivity of no greater than $10^{13}$ $\Omega$-cm at ambient temperature, the dielectric material desirably has a volume resistivity of at least $10^8$ $\Omega$-cm at ambient temperature. This range of volume resistivity allows the reticle chuck to hold the reticle sufficiently strongly to accommodate reticle-stage accelerations and decelerations as high as 1 ×g.

As discussed later below, the speed with which the reticle is secured to or removed from the reticle chuck is not a significant factor of microlithographic throughput. Hence, even though more time normally is required to turn a Johnsen-Rahbek force on and off, compared to a Coulomb force, such increased time is immaterial with respect to throughput because the time is expended in securing a reticle to or removing a reticle from the reticle chuck. Thus, the benefits of the Johnsen-Rahbek force can be exploited in this invention without any detriment.

Because the Johnsen-Rahbek force holds the reticle more strongly, per unit area of reticle actually contacting the surface of the reticle chuck, than a Coulomb force, use of the Johnsen-Rahbek force also allows the area of the reticle actually contacting the reticle chuck to be reduced. This allows more of the area of the reticle to be used for pattern definition. In addition or alternatively, the portion of the reticle actually contacting the reticle chuck can be spaced more distantly on the reticle from the patterned region, thereby reducing the probability of damage to the patterned region during use.

Any of the reticle chucks according to the invention can be configured to attract and hold a reticle mounted in a reticle frame, wherein the Johnsen-Rahbek electrostatic attraction acts on the reticle frame.

According to another aspect of the invention, charged-particle-beam microlithography apparatus are provided. An embodiment of such an apparatus comprises, in order along an axis, a charged-particle-beam source, an illumination-optical system, a reticle stage, a projection-lens system, and a wafer stage. The reticle stage is configured, for example, as any of the reticle stages summarized above.

According to yet another aspect of the invention, methods are provided for holding a reticle for use in charged-particle-beam microlithography. In an embodiment of such a method, a reticle-contacting surface is provided on an electrostatic chuck. The reticle-contacting surface comprises a dielectric material. At least one electrode is situated beneath the reticle-contacting surface. The dielectric material situated between the electrode and the reticle-contacting surface has a volume resistivity of no greater than $10^{13}$ Ω-cm (preferably greater than $10^8$ Ω-cm) at ambient temperature. The electrode is energized so as to generate an electrostatic force that attracts and holds the reticle to the reticle-contacting surface. As a result of the stronger reticle-holding force provided by the reticle chuck, the position of the reticle on the chuck does not shift whenever the reticle stage moves. This eliminates the need to correct faulty reticle positioning, resulting in improved throughput.

In another embodiment of a method according to the invention, a reticle-contacting surface comprising a dielectric material is provided on an electrostatic chuck. At least one electrode is provided beneath the reticle-contacting surface. The dielectric material situated between the electrode has a dielectric property sufficient, when the electrode is energized, to attract and hold a reticle by Johnsen-Rahbek electrostatic attraction. The reticle is attracted to and held by the reticle-contacting surface whenever the electrode is energized so as to generate the Johnsen-Rahbek electrostatic force.

The invention also encompasses methods for performing CPB microlithography of a pattern, defined by a reticle, onto a wafer substrate. In an embodiment of such a method, a reticle is provided that defines the pattern. The reticle is held in a reticle chuck as summarized above. The reticle chuck is mounted on a reticle stage. An illumination beam is passed through the reticle to form a patterned beam. The patterned beam is passed through a projection-lens system to a sensitive substrate.

The invention also encompasses methods for manufacturing a semiconductor device, in which methods CPB microlithography is performed as summarized above.

The foregoing and other features and advantages of the invention will be more readily apparent from the following detailed description, which proceeds with reference to the accompanying drawings.

DETAILED DESCRIPTION

General Considerations

A reticle held by a reticle chuck according to the present invention is used typically for the microlithographic projection-transfer of a pattern using a charged particle beam (e.g., electron beam or ion beam). Such a reticle can be, for example, a scattering-stencil reticle or a scattering-membrane reticle.

A scattering-stencil reticle includes a charged-particle-beam (CPB)-scattering membrane having a thickness of at most a few micrometers (which causes significant forward scattering of incident charged particles). Openings (voids) in the membrane are transmissive to charged particles and thus, in combination with the surrounding portions of the membrane, define the pattern elements ("features") to be transferred.

A scattering-membrane reticle, on the other hand, includes a membrane, transmissive to the charged particles of an incident charged particle beam, that is no thicker than about 1 micrometer. Hence, incident charged particles pass through the membrane without significant scattering. Regions of a CPB-scattering substance (which causes substantial scattering of incident charged particles) are present on the membrane in selected locations to define, in combination with the surrounding membrane, the pattern features. Because of the requirements of these reticles in terms of CPB-scattering characteristics and workability, they typically are made using a silicon wafer substrate on which various dielectric films can be formed.

Methods for performing microlithographic exposures using a charged particle beam include "cell projection" and "variable-shaped beam" methods. In these methods, the reticles basically are metal reticles having a thickness of a few millimeters, and are held mechanically during use. General reticle-holding in optical microlithography is performed using a vacuum chuck. However, a reticle chuck employing vacuum is not practical for CPB microlithography in which the reticle is situated in a vacuum during use. As a result, reticles used for CPB microlithography desirably are held electrostatically to a reticle chuck.

In order to prevent slipping of the reticle on the reticle chuck, conventional wisdom dictates that the attractive force applied by the chuck upon the reticle be increased. Such increases can be achieved by increasing the area of surface contact between the reticle and the surface of the reticle chuck, or by increasing the attractive force per unit area (by increasing the voltage applied to the electrodes) of the chuck. As is evident from FIG. 5, an increase in the area of surface contact would result in a corresponding undesired reduction in the size of the pattern area 505. This leaves increasing the attractive force per unit area as the only viable solution to the problem.

In a conventional electrostatic chuck, the volume resistivity of the material (dielectric) situated between the electrodes and the reticle is typically $10^{15}$ Ω-cm at ambient temperature. The electrostatic attractive force generated in such a chuck is typically of the Coulomb type. A Coulomb-type electrostatic attractive force is responsive to rapid changes in applied voltage to the electrodes, and thus is often employed in wafer chucks.

With a reticle chuck, however, unlike a wafer chuck, the time required for holding and releasing the reticle has no significant impact on device throughput. Accordingly, in developing the present invention, it was decided to ignore the times required for clamping and releasing, and to consider using a Johnsen-Rahbek electrostatic chucking force as a way of increasing the attractive force applied to the reticle.

Experiments were conducted to confirm the effect on holding force of reducing the volume resistance of the material between the electrodes and the reticle. In the experimental results, high values of Johnsen-Rahbek attractive force were obtained.

To reiterate, the present invention is based on the discovery of a reticle-holding method and reticle chuck appropriate for use under the following conditions in which the chuck:

(1) is capable of holding, by electrostatic attraction, a reticle that, unlike prior reticles, is machined from a silicon wafer rather than a metal;

(2) does not require increases in the surface contact area of the reticle substrate to the chuck surface to increase the attractive force, because doing so would require a corresponding decrease in the available pattern-forming area of the reticle; and (3) causes no adverse effect on throughput.

Representative Embodiments

Figure 1:
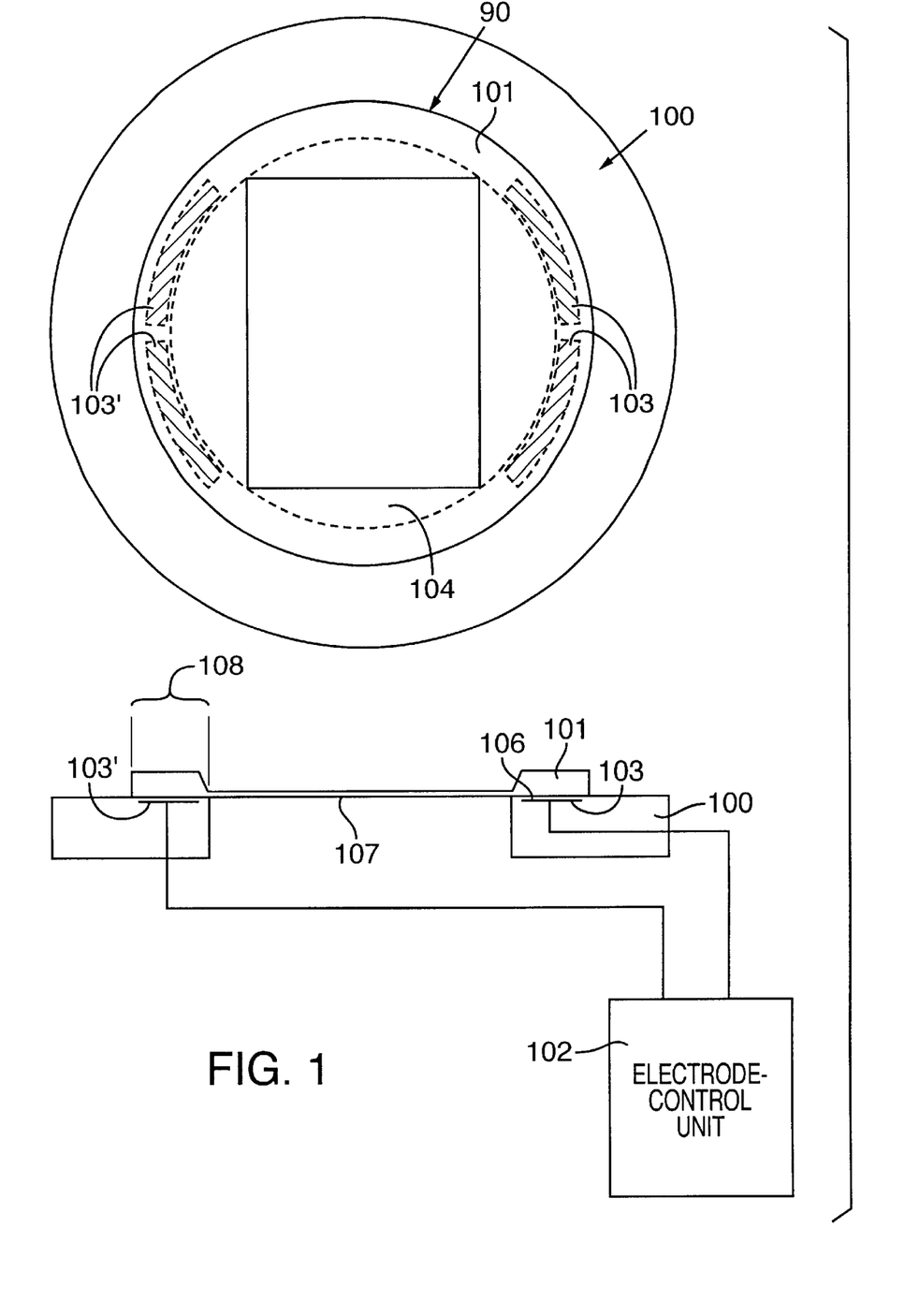
FIG. 1 provides two orthographic views of a first representative embodiment of a reticle chuck according to the invention configured to produce a Johnsen-Rahbek force by adjusting the volume resistivity of a material disposed between electrodes and a reticle substrate.

A first representative embodiment of a reticle chuck 100 according to the invention is shown in FIG. 1. The reticle chuck 100 is configured to hold a reticle 90. The reticle 90 comprises a reticle substrate 101 made of monocrystalline silicon. In a central region 104 of the reticle 90, the reticle substrate 101 is thin to form the reticle membrane 107. The reticle membrane 107 is the "pattern-defining" portion of the reticle 90. The reticle chuck 100 comprises electrodes 103, 103' connected to an electrode-control unit 102. Between the electrodes 103, 103' and the reticle substrate is a layer 106 of a dielectric material. Application of a voltage to the electrodes 103, 103' by the electrode-control unit 102 results in generation of an electrostatic attractive force between the electrodes 103, 103' and the reticle substrate 101 across the dielectric 106, thereby "clamping" the reticle 90 to the reticle chuck 100. If the volume resistivity of the dielectric layer 106 (e.g., in a "holding region" 108) is maintained at a value that is, for example, no greater than $10^{13}$ $\Omega$-cm, an electrical charge will accumulate in the gap between the surface of the reticle 90 and the surface of the holding region 108, thereby producing a strongly attractive Johnsen-Rahbek force. The Johnsen-Rahbek force is about ten times stronger than the holding force that would otherwise be provided by a Coulomb-type electrostatic chuck including a conventional dielectric having a volume resistivity of $10^{15}$ $\Omega$-cm or more. For example, with an applied voltage of 1000 V dc to the electrodes, a conventional electrostatic chuck produces a Coulomb attractive force of 200 gf/cm$^2$. In contrast, with a reticle chuck according to the invention, an applied voltage of only 600 V to the electrodes 103, 103' produces a Johnsen-Rahbek attractive force of 2000 gf/cm$^2$. In addition to its very large reticle-clamping force, a reticle chuck according to the invention makes possible a substantial reduction in the electrode surface area compared to a conventional chuck. (For example, compare the surface areas of the electrodes 103, 103' in FIG. 1 with the surface areas of the electrodes 503, 503' of the conventional chuck shown in FIG. 5.) As can be seen by comparing FIGS. 1 and 5, a reticle chuck according to the present invention allows a corresponding increase in the area of the region 107 that can be used to define the pattern.

As noted above, the power on-off responsiveness of a system that generates a Johnsen-Rahbek force is generally not as rapid as that of a system that generates a Coulomb force. However, because reticle-replacement time does not affect directly the throughput of a microlithography apparatus, the slower responsiveness of a reticle chuck according to the invention is not a problem.

As the volume resistivity of the dielectric material is decreased to less than $10^8$ $\Omega$-cm, the flow of leakage current from the electrodes 103, 103' to the reticle 90 increases to a level at which the trajectories of charged particles passing through the reticle 90 could be affected adversely. It is therefore preferred that the volume resistivity of the dielectric be at least $10^8$ $\Omega$-cm.

With a reticle chuck according to this embodiment, a reticle 90 is held such that the pattern-defining region 107 facilitates use of the height of the pattern-defining region as a reference point, thus simplifying system alignment. I.e., referring to FIG. 1, the reticle pattern is held on the upstream-facing surface of the chuck 100, so that the height of the reticle pattern is not affected by the thickness of the reticle or reticle support frame, thereby facilitating easy alignment of the surface of the chuck 100.

Figure 2:
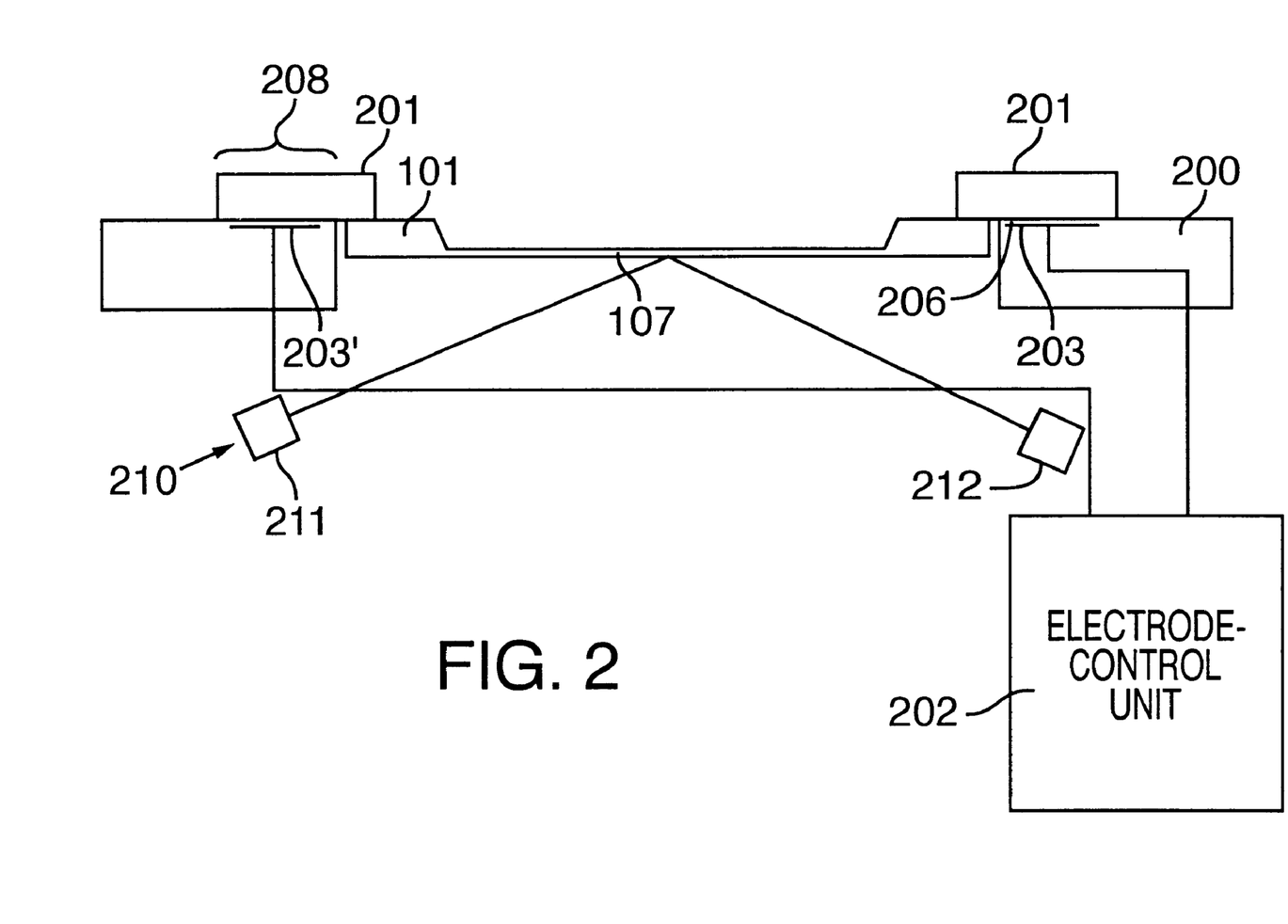
FIG. 2 is an elevational view of a second representative embodiment of a reticle chuck according to the invention, wherein the reticle substrate is mounted to a reticle support frame that is attracted to the reticle chuck by a Johnsen-Rahbek force.

A second representative embodiment of a reticle chuck 200 is shown in FIG. 2. In this embodiment, a reticle-support frame 201 is joined to the reticle substrate 101 to allow the reticle substrate 101 to rest on and be held by the reticle chuck 200. The volume resistivity of the dielectric 206 in the holding portion 208 is sufficiently low so as to ensure generation of a Johnsen-Rahbek attractive force. For reasons as discussed above, the volume resistivity desirably is no greater than $10^{13}$ $\Omega$-cm. The reticle-support frame 201 desirably is ring-shaped and made of a material (e.g., silicon) having at least some electrical conductivity. Retention of the reticle in a reticle-support frame 201 reduces the probability of reticle damage, eliminates a need to reduce the size of the patterned region 207 of the reticle, and allows an increase in area of the region 208 attracted to the reticle chuck 200. Also, with this embodiment, a reticle-height sensor can be provided for determining a reticle-surface height reference. I.e., in FIG. 2, alignment of the top surface of the chuck 200 does not necessarily achieve alignment of the reticle pattern. A reticle-height sensor 210 is provided as shown for this purpose. The sensor 210 comprises an LED or laser diode 211 and a detector 212.

A reticle chuck according to this embodiment can be used in any of various CPB microlithography systems, thereby providing a CPB microlithography system that exhibits substantially no problems with positional displacements of the reticle on the reticle chuck.

Figure 6:
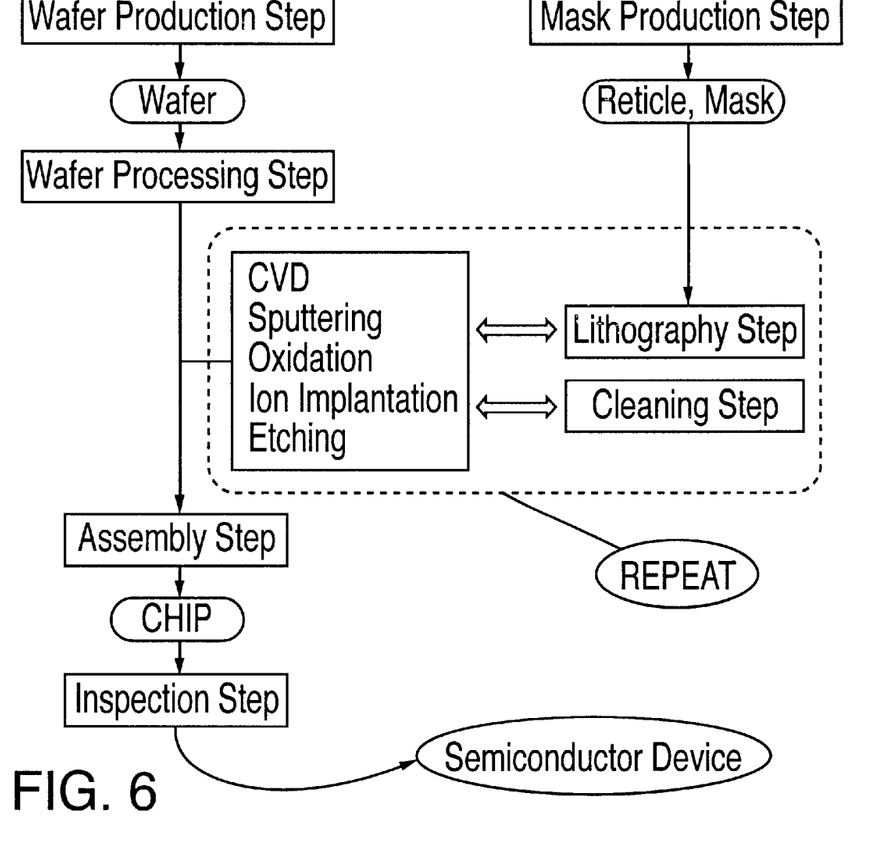
FIG. 6 is a process flowchart for manufacturing a semiconductor device, wherein the process includes a microlithography method performed using a reticle chuck according to the invention.

FIG. 6 is a flowchart of an exemplary semiconductor fabrication method to which apparatus and methods according to the invention can be applied readily. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps,. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or of the wafer substrate itself; (3) etching or analogous step to etch the thin film or wafer substrate according to the resist pattern, or doping as required to implant ions or impurities into the thin film or wafer substrate according to the resist pattern; (4) resist stripping to remove the resist from the wafer; and (5) chip inspection. Wafer processing is repeated as required (typically many times) to fabricate the desired semiconductor chips on the wafer.

Figure 7:
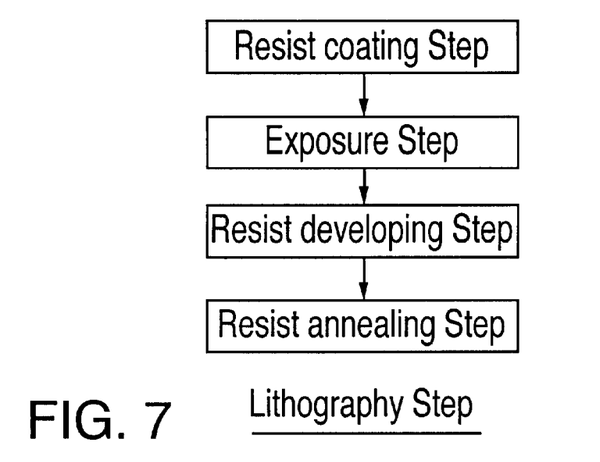
FIG. 7 is a process flow chart for performing a microlithography method that includes certain steps performed during the microlithography step shown in FIG. 6.

FIG. 7 provides a flow chart of typical steps performed in microlithography, which is a principal step in wafer processing. The microlithography step typically includes: (1) a resist-coating step, wherein a suitable resist is coated on the wafer substrate (which can include a circuit element formed in a previous wafer-processing step); (2) an exposure step, to expose the resist with the desired pattern; (3) a development step, to develop the exposed resist; and (4) an optional annealing step, to enhance the durability of the resist pattern.

Within these main steps one main step having a decisive influence on the performance of semiconductor devices produced is the wafer-processing step. In this step, patterns for the designed circuit are formed in sequential superposed layers. Many such layers usually are formed in the manufacture of most types of semiconductor devices such as microprocessors and memories. Wafer-processing steps typically include film-forming steps, oxidizing steps, microlithography steps, etching steps, implantation steps, resist-stripping steps, and inspection steps. A film-forming step usually is performed using chemical vapor deposition (CVD) or sputtering for forming a dielectric film used as an insulating layer or for forming a metal thin film for forming wiring and electrodes. An oxidation step is performed for oxidizing a thin-film layer or a wafer substrate. A microlithography step is performed using a reticle for selectively machining thin-film layers, the wafer substrate, or the like to form a resist pattern. An etching step can be performed using, e.g., a dry-etch technology to "machine" the thin films or substrates to conform to the resist pattern. The implantation step results in implantation of a dopant into a layer. The resist-stripping step results in removal of a layer of resist. In the inspection step the wafers are inspected before undergoing additional processing. These wafer-processing steps are repeated as required for each layer, ultimately to produce wafers to be incorporated into finished semiconductor devices.

Methods and apparatus according to the invention can be applied to a semiconductor fabrication process, as summarized above, to provide substantially reduced time expended in aligning and re-aligning the reticle, thereby improving overall throughput.

Whereas the invention has been described in connection with several representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An electrostatic reticle chuck for holding a reticle as used in charged-particle-beam microlithography, comprising:

a reticle-contacting surface formed of a dielectric material;

at least one electrode situated beneath the reticle-contacting surface of the dielectric material; and the dielectric material at least along the reticle-contacting surface having a volume resistivity of no greater than $10^{13}$ $\Omega$-cm at ambient temperature.

2. The reticle chuck of claim 1, wherein the reticle is made of silicon.

3. A charged-particle-beam microlithography apparatus, comprising:

a charged-particle-beam source;

an illumination-optical system situated downstream of the source;

a reticle stage situated downstream of the illumination-optical system;

a projection-lens situated downstream of the reticle stage; and a wafer stage situated downstream of the projection-lens system, the reticle stage comprising a reticle chuck as recited in claim 1.

4. A method for manufacturing a semiconductor device, comprising the steps:

(a) preparing a wafer;

(b) processing the wafer; and (c) assembling devices formed on the wafer during steps (a) and (b), wherein step (b) comprises the steps of (i) applying a resist to the wafer; (ii) exposing the resist; and (iii) developing the resist; and step (ii) comprises providing a charged-particle-beam microlithography apparatus as recited in claim 3; and using the charged-particle-beam microlithography apparatus to expose the resist with the pattern defined on the reticle.

5. A semiconductor device produced by the method of claim 4.

6. An electrostatic reticle chuck for holding a reticle as used in charged-particle-beam microlithography, comprising:

a reticle-contacting surface formed of a dielectric material;

at least one electrode situated beneath the reticle-contacting surface of the dielectric material; and the reticle chuck being configured to attract and hold a reticle by Johnsen-Rahbek electrostatic attraction.

7. The reticle chuck of claim 6, wherein the dielectric material beneath which an electrode is situated has a volume resistivity of no greater than $10^{13}$ $\Omega$-cm at ambient temperature.

8. The reticle chuck of claim 7, wherein the dielectric material has a volume resistivity of at least $10^8$ $\Omega$-cm at ambient temperature.

9. The reticle chuck of claim 6, configured to attract and hold a reticle mounted in a reticle frame, wherein the Johnsen-Rahbek electrostatic attraction acts on the reticle frame.

10. The reticle chuck of claim 9, wherein the dielectric material beneath which an electrode is situated has a volume resistivity of no greater than $10^{13}$ $\Omega$-cm at ambient temperature.

11. The reticle chuck of claim 10, wherein the dielectric material has a volume resistivity of at least $10^8$ $\Omega$-cm at ambient temperature.

12. A charged-particle-beam microlithography apparatus, comprising:

a charged-particle-beam source;

an illumination-optical system situated downstream of the source;

a reticle stage situated downstream of the illumination-optical system;

a projection-lens situated downstream of the reticle stage; and a wafer stage situated downstream of the projection-lens system, the reticle stage comprising a reticle chuck as recited in claim 6.

13. A method for manufacturing a semiconductor device, comprising the steps:

(a) preparing a wafer;

(b) processing the wafer; and (c) assembling devices formed on the wafer during steps (a) and (b), wherein step (b) comprises the steps of (i) applying a resist to the wafer; (ii) exposing the resist; and (iii) developing the resist; and step (ii) comprises providing a charged-particle-beam microlithography apparatus as recited in claim 12; and using the charged-particle-beam microlithography apparatus to expose the resist with the pattern defined on the reticle.

14. A semiconductor device produced by the method of claim 13.

15. A method for holding a reticle for use in charged-particle-beam microlithography, comprising:

providing on an electrostatic chuck a reticle-contacting surface comprising a dielectric material;

providing at least one electrode beneath the reticle-contacting surface, wherein the dielectric material situated between the electrode and the reticle-contacting surface has a volume resistivity of no greater than $10^{13}$ Ω-cm at ambient temperature; and energizing the electrode so as to generate an electrostatic force that attracts and holds the reticle to the reticle-contacting surface.

16. A method for performing charged-particle-beam microlithography of a pattern, defined by a reticle, onto a wafer substrate, comprising:

providing a reticle defining the pattern;

holding the reticle using a reticle chuck by a method as recited in claim 15;

mounting the reticle chuck on a reticle stage;

passing an illumination beam through the reticle to form a patterned beam; and passing the patterned beam through a projection-lens system to a sensitive substrate.

17. A method for manufacturing a semiconductor device, comprising the steps:

(a) preparing a wafer;

(b) processing the wafer; and (c) assembling devices formed on the wafer during steps (a) and (b), wherein step (b) comprises a method for performing charged-particle-beam microlithography as recited in claim 16.

18. A semiconductor device produced by the method of claim 17.

19. A method for holding a reticle for use in charged-particle-beam microlithography, comprising:

providing on an electrostatic chuck a reticle-contacting surface comprising a dielectric material;

providing at least one electrode beneath the reticle-contacting surface, wherein the dielectric material situated between the electrode has a dielectric property sufficient, when the electrode is energized, to attract and hold a reticle by Johnsen-Rahbek electrostatic attraction; and energizing the electrode so as to generate the Johnsen-Rahbek electrostatic force so as to attract and hold the reticle to the reticle-contacting surface.

20. A method for performing charged-particle-beam microlithography of a pattern, defined by a reticle, onto a wafer substrate, comprising:

providing a reticle defining the pattern;

holding the reticle using a reticle chuck by a method as recited in claim 19;

mounting the reticle chuck on a reticle stage;

passing an illumination beam through the reticle to form a patterned beam; and passing the patterned beam through a projection-lens system to a sensitive substrate.

21. A method for manufacturing a semiconductor device, comprising the steps:

(a) preparing a wafer;

(b) processing the wafer; and (c) assembling devices formed on the wafer during steps (a) and (b), wherein step (b) comprises a method for performing charged-particle-beam microlithography as recited in claim 20.

22. A semiconductor device produced by the method of claim 21.

* * * * *

UNITED STATES PATENT AND TRADEMARK OFFICE
CERTIFICATE OF CORRECTION

PATENT NO. : 6,433,346 B1
DATED : August 13, 2002
INVENTOR(S) : Noriyuki Hirayanagi

It is certified that error appears in the above-identified patent and that said Letters Patent is hereby corrected as shown below:

Column 1,
Line 40, "hat" should be -- has --

Column 8,
Line 53, "sub-steps.," should be -- sub-steps. --

Signed and Sealed this

Fifteenth Day of July, 2003

JAMES E. ROGAN
*Director of the United States Patent and Trademark Office*